(12) United States Patent
Li et al.

(10) Patent No.: US 11,423,948 B2
(45) Date of Patent: Aug. 23, 2022

(54) STORAGE CHASSIS AND ELECTRONIC APPARATUS COMPRISING THE SAME

(71) Applicant: CELESTICA TECHNOLOGY CONSULTANCY (SHANGHAI) CO. LTD, Shanghai (CN)

(72) Inventors: Wenjin Li, Shanghai (CN); Yu Wang, Shanghai (CN); Shanping Huang, Shanghai (CN); Ting Li, Shanghai (CN)

( * ) Notice: Subject to any disclaimer, the term of this patent is extended or adjusted under 35 U.S.C. 154(b) by 0 days.

(21) Appl. No.: 16/529,711

(22) Filed: Aug. 1, 2019

(65) Prior Publication Data
US 2020/0075058 A1  Mar. 5, 2020

(51) Int. Cl.
*G11B 33/04* (2006.01)
*G11B 33/12* (2006.01)
*H05K 7/20* (2006.01)

(52) U.S. Cl.
CPC ........ *G11B 33/0422* (2013.01); *G11B 33/126* (2013.01); *G11B 33/128* (2013.01); *H05K 7/20736* (2013.01)

(58) Field of Classification Search
CPC . G11B 33/0422; G11B 33/126; G11B 33/128; H05K 7/20736; H05K 7/1491
See application file for complete search history.

(56) References Cited

U.S. PATENT DOCUMENTS

| | | | |
|---|---|---|---|
| 9,466,964 B1* | 10/2016 | Watson | H05K 7/1491 |
| 9,578,779 B2* | 2/2017 | Yi | A47B 21/06 |
| 9,706,687 B1* | 7/2017 | Frangioso, Jr. | H05K 7/20709 |
| 9,763,362 B1* | 9/2017 | Xu | G11B 33/128 |
| 9,904,336 B1* | 2/2018 | Khan | H05K 7/20145 |
| 10,154,608 B1* | 12/2018 | Johnson | F16F 1/10 |
| 10,178,798 B1* | 1/2019 | Christensen | G06F 1/20 |
| 10,212,842 B1* | 2/2019 | Schulze | H05K 7/1488 |
| 10,219,403 B2* | 2/2019 | Easton | H05K 7/20736 |
| 10,420,247 B2* | 9/2019 | Chen | H05K 7/1491 |
| 2007/0227756 A1* | 10/2007 | Doerr | H05K 7/1491 174/69 |
| 2008/0239657 A1* | 10/2008 | Oyama | G11B 33/128 361/679.37 |
| 2010/0258350 A1* | 10/2010 | Hallett | H05K 7/1491 174/99 R |
| 2016/0073544 A1* | 3/2016 | Heyd | G06F 1/187 361/679.31 |
| 2017/0285698 A1* | 10/2017 | Kobayashi | H05K 7/20154 |
| 2017/0367211 A1* | 12/2017 | Easton | H05K 7/183 |
| 2018/0063986 A1* | 3/2018 | Chen | H05K 7/1492 |
| 2018/0322082 A1* | 11/2018 | Breakstone | G06F 13/28 |

* cited by examiner

*Primary Examiner* — James Wu
*Assistant Examiner* — Christopher L Augustin
(74) *Attorney, Agent, or Firm* — Global IP Services; Tianhua Gu

(57) ABSTRACT

The present disclosure provides a storage chassis and an electronic device including the storage chassis. The storage chassis has a first receiving space at an upper portion of a rear end, the first receiving space is configured to be shared by a plurality of functional modules, and each functional module includes cable management supports, CPU computation control modules or storage hard disks. In the present disclosure, more modules can be arranged in a limited chassis space flexibly and reasonably, thereby improving the utilization of the chassis space and implementing configuration of various functions.

9 Claims, 3 Drawing Sheets

STORAGE CHASSIS AND ELECTRONIC APPARATUS COMPRISING THE SAME

CROSS REFERENCES TO RELATED APPLICATIONS

This application claims the benefits of priority to Chinese Patent Application No. CN2018110212442, entitled "Storage Chassis and Electronic Apparatus Comprising the Same", filed with the Chinese Patent Office on Sep. 8, 2018, and Chinese Patent Application No. CN2018214402579, entitled "Storage Chassis and Electronic Apparatus Comprising the Same", filed with the Chinese Patent Office on Sep. 8, 2018, the contents of which are incorporated herein by reference in its entirety.

BACKGROUND OF THE PRESENT INVENTION

Field of Invention

The present application relates to the technical field of chassis, and in particular, to a highly integrated storage chassis with high performance and an electronic apparatus comprising the storage chassis.

Description of Related Arts

Along with the development of the communications industry, structural designs of communication equipment, especially high-density high-performance designs, need to meet higher requirements. In order to realize more functions, a number of electronic modules are usually disposed in a chassis of existing communications equipment. Therefore, arranging more modules reasonably and neatly in a limited space to improve the cost performance of products and bring better experience to users becomes a development trend of communications equipment.

How to configure a chassis flexibly and arrange modules in the chassis reasonably becomes a problem that persons skilled in the art are concerned with.

SUMMARY OF THE PRESENT INVENTION

The present application provides a storage chassis and an electronic apparatus comprising the storage chassis, to arrange modules in the chassis flexibly and reasonably.

The present application provides a storage chassis, where the storage chassis has a first receiving space at an upper portion of a rear end, the first receiving space is configured to be shared by a plurality of functional modules, and each functional module comprises cable management supports, CPU computation control modules or storage hard disks.

In an embodiment of the present application, the storage chassis has a second receiving space at a lower portion of the rear end, and the second receiving space is divided into a first-layer assembly area and a second-layer assembly area located above the first-layer assembly area.

In an embodiment of the present application, when cable management supports are assembled in the first receiving space, two data control modules are assembled in the first-layer assembly area, and four power source modules and two direct current control modules are assembled in the second-layer assembly area.

In an embodiment of the present application, the direct current control modules are assembled in the middle of the second-layer assembly area, and each side of direct current control module is provided with two power source modules.

In an embodiment of the present application, when CPU computation control modules are assembled in the first receiving space, cable management supports are respectively assembled in adjacent spaces of the first-layer assembly area and the second-layer assembly area of the second receiving space.

In an embodiment of the present application, the first receiving space is laterally divided into an upper assembly sub-area and a lower assembly sub-area, and one CPU computation control module is assembled in each assembly sub-area.

In an embodiment of the present application, when storage hard disks are assembled in the first receiving space, cable management supports are respectively assembled in adjacent spaces of the first-layer assembly area and the second-layer assembly area of the second receiving space.

In an embodiment of the present application, the first receiving space is longitudinally divided into four assembly sub-areas, and each sub-area is provided with three storage hard disks laterally.

In an embodiment of the present application, the storage chassis is provided with slide rail on both sides, so that the chassis body of the storage chassis is slidable with respect to sliding slots mounted on the slide rail.

In an embodiment of the present application, a plurality of storage hard disks and a plurality of fan modules are configured in the storage chassis, upper surfaces of covers of the storage hard disks and upper surfaces of the fan modules form an upper surface of the storage chassis, and the storage hard disks and the fan modules can be drawn out and placed in from the top of the chassis.

The present application further provides an electronic device, the electronic device comprising the storage chassis described above.

As described above, the storage chassis and the electronic apparatus comprising the storage chassis according to the present application have the following beneficial effects:

In the present application, a first receiving space is configured at an upper portion of a rear end of a storage chassis for placing different functional modules such as cable management supports, CPU computation control modules or storage hard disks, so that more modules can be arranged in a limited chassis space flexibly and reasonably, thereby improving the utilization of the chassis space and implementing configuration of various functions.

DESCRIPTIONS OF REFERENCE MARK NUMBERS

Figure 1:
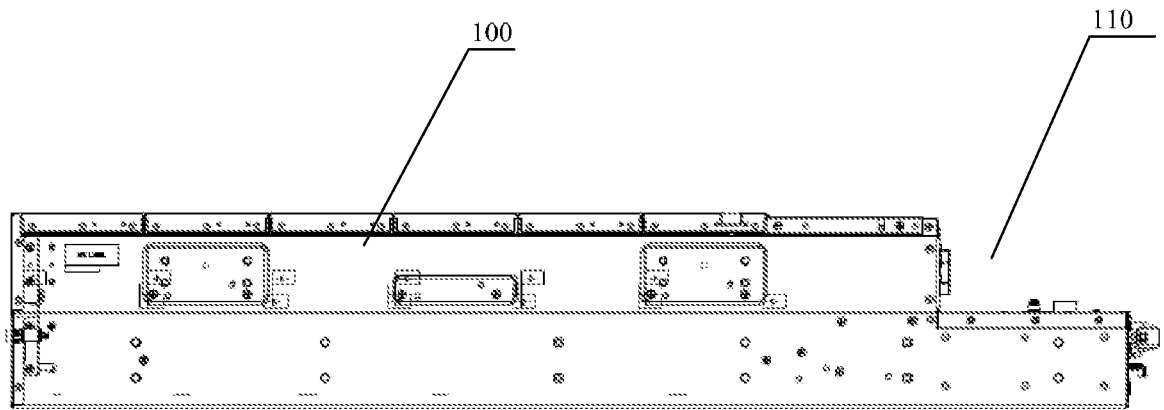
FIG. 1 is a schematic diagram of a storage chassis in an embodiment of the present disclosure.

100 Storage chassis
110 First receiving space

111 Cable management support
112 CPU computation control module
113 Storage hard disk
120 Second receiving space
121, 122 Data control module
123 Direct current control module
124, 125 Power source module
126 Cable management support
130 Slide rail
140 Storage hard disk
150 Fan module

DETAILED DESCRIPTION OF THE
PREFERRED EMBODIMENTS

Implementations of the present disclosure are illustrated below through specific embodiments. Persons skilled in the art can easily understand other advantages and efficacy of the present disclosure according to the content disclosed in this specification.

It should be noted that the structures, scales, sizes and the like drawn in the accompanying drawings of this specification are all merely used to cooperate with the content disclosed in the specification so as to help persons skilled in the art understand and read the content, but are not used to define limiting conditions for implementing the present disclosure and therefore do not have any substantial technical meanings. Any modifications on the structures, changes in the scale relations or adjustment in the sizes that do not affect the efficacy and objects of the present disclosure should still fall within the scope covered by the technical content disclosed by the present disclosure. Meanwhile, terms such as "upper", "lower", "left", "right", "middle" and "one" mentioned in this specification are merely used for the clarity of the description, and are not intended to limit the implementation scope of the present disclosure. Changes or adjustments in relative relations thereof without changing the technical content substantially should also be considered as the implementation scope of the present disclosure.

In actual application, for example, when used in an Over The Top (OTT) high-density server, the storage chassis 100 according to the present disclosure is preferably a 4 U chassis. "U", short for unit, represents external size of the server. Detailed dimensions are determined by the Electronic Industries Alliance (EIA). Dimensions of a server are specified because the server needs to be placed on an iron or aluminum rack. The rack is provided with screw holes for securing the server. The screw hole on the rack is aligned with a screw hole on the server, and then secured with a screw. The specified dimension has the width (48.26 cm=19 inches) and the height (multiples of 4.445 cm) of the server. Because the width is 19 inches, a rack meeting this specification is sometimes referred to as a "19-inch rack". The thickness has a basic unit of 4.445 cm. 1 U means 4.445 cm; 2 U means twice 1 U, that is, 8.89 cm and so on). In other words, a "1 U server" is a product having an appearance meeting the EIA specifications and a thickness of 4.445 cm. A product designed to be suitable for a 19-inch chassis is generally referred to as a rack server. Obviously, in actual application, the dimensions of the storage chassis 100 according to the present disclosure are not limited thereto, and storage chassis 100 of other dimensions is also applicable to the technical solution of the present disclosure.

The present disclosure provides a storage chassis 100. The storage chassis 100 has a first receiving space 110 at an upper portion of a rear end. The first receiving space 110 is configured to be shared by a plurality of functional modules, each functional module includes a cable management support 111, CPU computation control modules 112 or storage hard disks 113.

Specifically, in this embodiment, the storage chassis 100 comprises two side walls and a bottom plate connecting the two side walls. The two side walls and the bottom plate may be fixedly connected by using a screw or a buckle, or the two side walls and the bottom plate may have an integrated structure. The storage chassis 100 has a front end and a rear end opposite to the front end along the two side walls. The storage chassis 100 has a first receiving space 110 at an upper portion of the rear end, where the first receiving space 110 is equivalent to a notch for receiving different functional modules.

In this embodiment, the first receiving space 110 is configured to be shared by a plurality of functional modules, each functional module comprises cable management supports 111, CPU computation control modules 112 or storage hard disks 113. By configuring the first receiving space at the upper portion of the rear end of the storage chassis 100 for receiving different functional modules such as cable management supports 111, CPU computation control modules 112 or storage hard disks 113, more modules can be arranged in a limited chassis space flexibly and reasonably, thereby improving the utilization of the chassis space and implementing configuration of various functions.

The following describes the structure of the first receiving space 110 in which the cable management supports 111, CPU computation control modules 112 or storage hard disks 113 are assembled.

In this embodiment, the storage chassis 100 has a second receiving space 120 at a lower portion of the rear end. Specifically, the second receiving space 120 is includes a first-layer assembly area and a second-layer assembly area located above the first-layer assembly area.

The first-layer assembly area and the second-layer assembly area each may be divided into a plurality of independent areas with the same height and arranged side by side.

Figure 2:
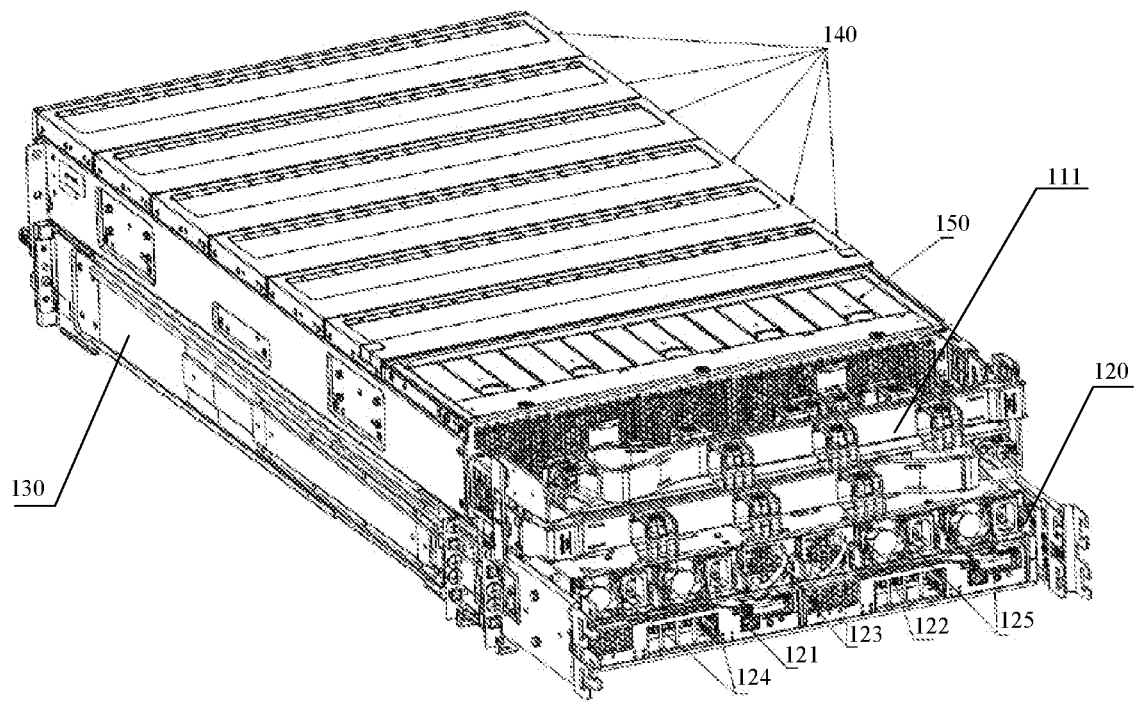
FIG. 2 is a schematic diagram of a storage chassis in which cable management supports are assembled in an embodiment of the present disclosure.

In this embodiment, as shown in FIG. 2, when cable management supports 111 are assembled in the first receiving space 110, two data control modules (a data control module 121 and a data control module 122) are assembled in the first-layer assembly area; four power source modules (power source modules 124 and power source modules 125, where there are two power source modules 124 and two power source modules 125 in FIG. 2) and two direct current control modules 123 are assembled in the second-layer assembly area.

In this embodiment, when cable management supports 111 are assembled in the first receiving space 110, the first receiving space 110 may be divided into an upper assembly area and a lower assembly area. One cable management support 111 is assembled in each assembly area, or two or more cable management supports 111 are stacked in each assembly area.

In this embodiment, the direct current control modules 123 are assembled in the middle of the second-layer assembly area; each side of the direct current control modules 123 is provided with two power sources.

That is, two data control modules (the data control module 121 and the data control module 122) are located at the bottom layer of the rear end of the storage chassis 100; four power source modules (the power source modules 124 and the power source modules 125, where there are two power source modules 124 and two power source modules 125 in FIG. 2) and two direct current control modules 123 are located at the bottom layer of the rear end of the chassis. These modules are symmetrically located at the rear end of the chassis.

Figure 3:
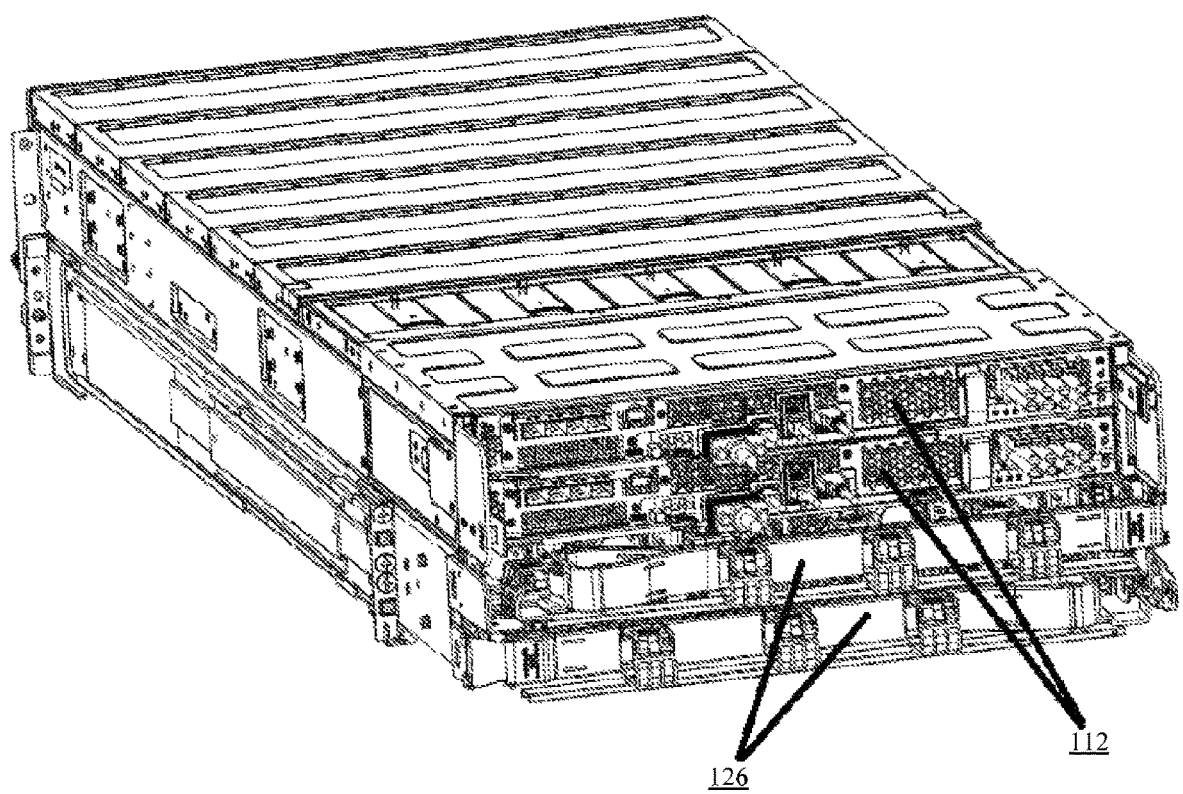
FIG. 3 is a schematic diagram of a storage chassis in which CPU computation control modules are assembled in an embodiment of the present disclosure.
Figure 4:
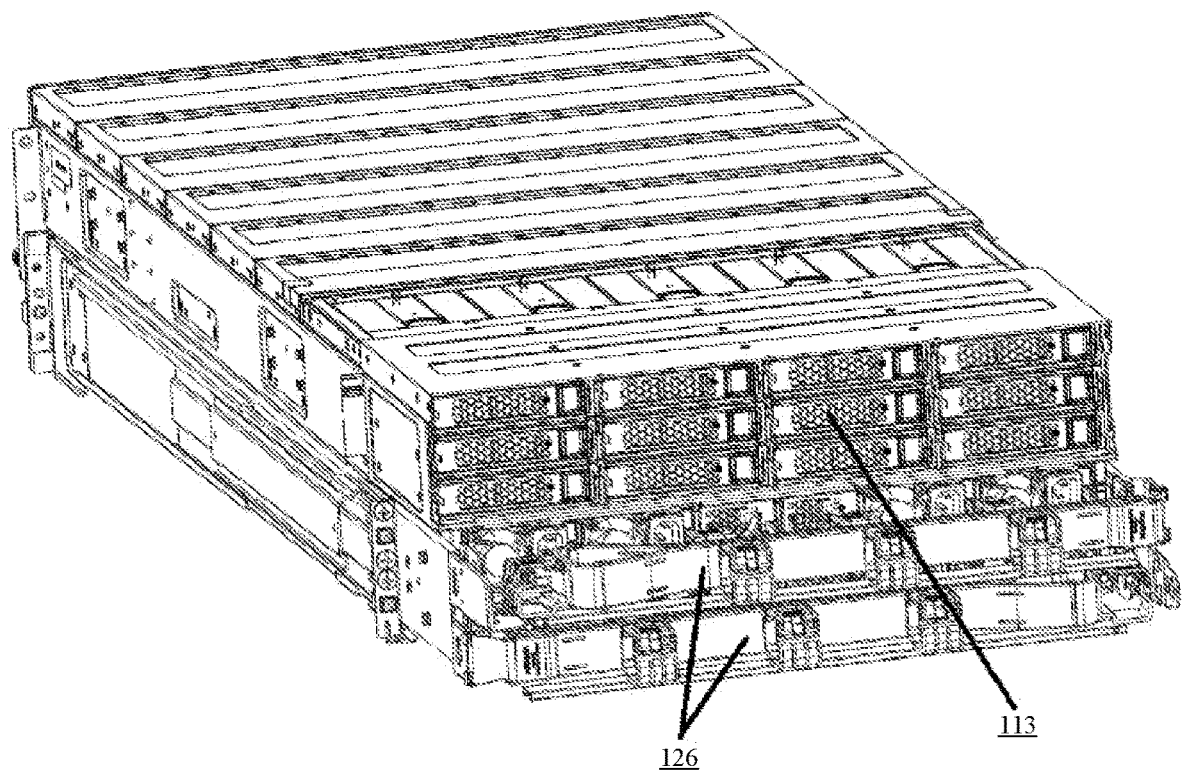
FIG. 4 is a schematic diagram of a storage chassis in which storage hard disks are assembled in an embodiment of the present disclosure.

In this embodiment, as shown in FIG. 3, when CPU computation control modules 112 are assembled in the first receiving space 110, the first receiving space is laterally divided into an upper assembly sub-area and a lower assembly sub-area, and each sub-area is used provided with one CPU computation control module. Cable management supports 126 are respectively assembled in adjacent spaces of the first-layer assembly area and the second-layer assembly area of the second receiving space 120.

That is, when CPU computation control modules 112 are assembled in the first receiving space 110 at the upper portion of the rear end of the storage chassis 100, cable management supports 126 are respectively assembled in adjacent spaces of the second receiving space 120 at the lower portion of the rear end of the storage chassis 100.

In this embodiment, when storage hard disks 113 are assembled in the first receiving space 110, cable management supports 126 are respectively assembled in adjacent spaces of the first-layer assembly area and the second-layer assembly area of the second receiving space 120.

When storage hard disks 113 are assembled in the first receiving space 110, the first receiving space is longitudinally divided into four assembly sub-areas, and three storage hard disks are assembled in each assembly sub-area laterally. Therefore, twelve storage hard disks are placed in the first receiving space.

That is, when storage hard disks 113 are assembled in the first receiving space 110, the first receiving space 110 accommodates twelve storage hard disks 113, and the cable management supports 126 are located below the storage hard disks 113.

Figure 5:
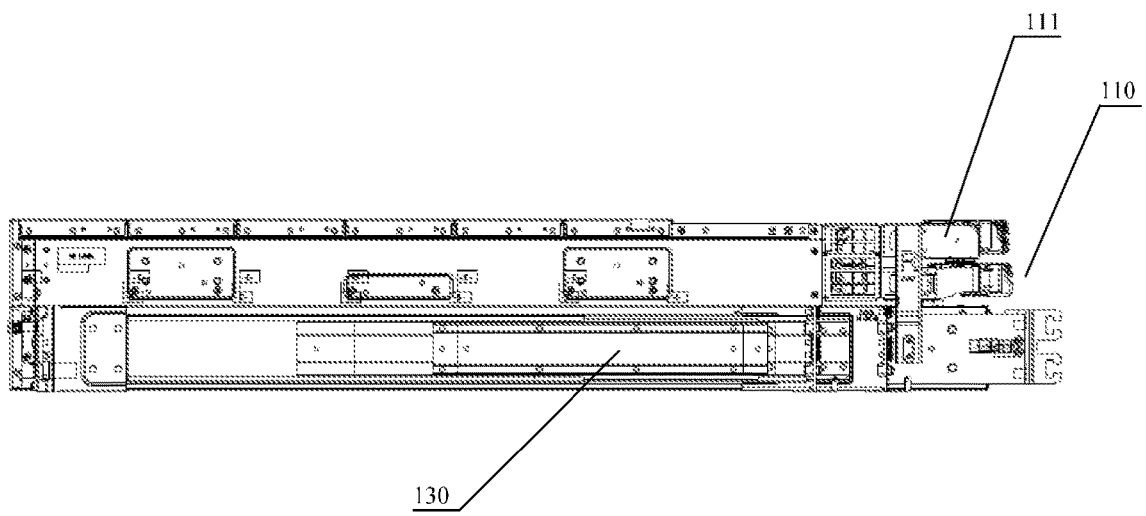
FIG. 5 is a schematic diagram of mounting positions of the slide rail on a storage chassis in an embodiment of the present disclosure.

In this embodiment, as shown in FIG. 2 and FIG. 5, the storage chassis 100 is provided with slide rail 130 on both sides, so that the chassis body of the storage chassis 110 is slidable with respect to sliding slots mounted on the slide rail 130. The storage chassis 100 can be drawn out by using the slide rail 130 on both sides of the storage chassis 100, so as to maintain the storage hard disks 140 and fan modules 150 in the storage chassis 100.

In this embodiment, as shown in FIG. 2, a plurality of storage hard disks 140 and a plurality of fan modules 150 are configured in the storage chassis 100. Upper surfaces of covers of the storage hard disks 140 and upper surfaces of the fan modules 150 form the upper surface of the storage chassis 100.

The plurality of fan modules 150 are arranged in a row and located between the first receiving space 110 and the plurality of storage hard disks 140, that is, located at one end of the storage chassis 100. For example, ninety storage hard disks 140 and five fan modules 150 are configured in the storage chassis 100. The upper surfaces of the covers of the storage hard disks 140 and the upper surfaces of the fan modules 150 form the upper surface of the storage chassis 100. In this way, the storage hard disks 140 and the fan modules 150 in the storage chassis 100 can be mounted and maintained from the top of the storage chassis 100.

Each fan module 150 comprises a fan frame and a fan, the fan is disposed in the fan frame.

In actual application, the storage chassis 100 further comprises an upper cover. The upper cover is formed by a plurality of sub-covers assembled together, or the upper cover may have an integrated structure. The upper cover is disposed opposite to the bottom plate on the top of the storage chassis 100. For example, in this embodiment, the upper cover comprises two parts: a plurality of sub-covers covering front end of the storage hard disks 140 and a plurality of sub-covers covering rear end of the upper surfaces of the fan modules 150. The two parts are independent of each other.

The present disclosure further provides an electronic apparatus. The electronic device comprises the storage chassis 100 described above.

In conclusion, in the present disclosure, a first receiving space 110 is configured at a rear end of a storage chassis 100 for placing different functional modules such as cable management supports 111, CPU computation control modules 112 or storage hard disks 113, so that more modules can be arranged in a limited chassis space flexibly and reasonably, thereby improving the utilization of the chassis space and implementing configuration of various functions. Therefore, the present disclosure effectively overcomes various disadvantages in the prior art and hence has high industrial use value.

The foregoing embodiments are only to illustrate the principle and efficacy of the present disclosure exemplarily, and are not to limit the present disclosure. Any person skilled in the art can make modifications or variations on the foregoing embodiments without departing from the spirit and scope of the present disclosure. Accordingly, all equivalent modifications or variations completed by persons of ordinary skill in the art without departing from the spirit and technical thinking disclosed by the present disclosure should fall within the scope of the claims of the present disclosure.

What is claimed is:

1. A storage chassis comprising:
   a first receiving space at an upper portion of a rear end, the first receiving space is configured to be shared by a plurality of functional modules, and each functional module comprises cable management supports, CPU computation control modules or storage hard disks;
   a second receiving space at a lower portion of the rear end, the second receiving space is equipped with a data control module, a power source module and a direct current control module;
   the second receiving space is divided into a first-layer assembly area and a second-layer assembly area located above the first-layer assembly area;
   when cable management supports are assembled in the first receiving space, two data control modules are assembled in the first-layer assembly area, and four power source modules and two direct current control modules are assembled in the second-layer assembly area;
   the first receiving space is a notch retracted from the second receiving space.

2. The storage chassis according to claim 1, wherein the direct current control modules are assembled in the middle of the second-layer assembly area, and each side of direct current control module is provided with two power source modules.

3. The storage chassis according to claim 1, wherein when CPU computation control modules are assembled in the first receiving space, cable management supports are respectively assembled in adjacent spaces of the first-layer assembly area and the second-layer assembly area of the second receiving space.

4. The storage chassis according to claim 3, wherein the first receiving space is laterally divided into an upper assembly sub-area and a lower assembly sub-area, and one CPU computation control module is assembled in each assembly sub-area.

5. The storage chassis according to claim 1, wherein when storage hard disks are assembled in the first receiving space, cable management supports are respectively assembled in adjacent spaces of the first-layer assembly area and the second-layer assembly area of the second receiving space.

6. The storage chassis according to claim 5, wherein the first receiving space is longitudinally divided into four sub-areas, each sub-area is provided with three storage hard disks laterally.

7. The storage chassis according to claim 1, wherein the storage chassis is provided with slide rail on both sides, so that the chassis body of the storage chassis is slidable with respect to sliding slots mounted on the slide rail.

8. The storage chassis according to claim 1, wherein a plurality of storage hard disks and a plurality of fan modules are configured in the storage chassis, upper surfaces of covers of the storage hard disks and upper surfaces of the fan modules form an upper surface of the storage chassis, and the storage hard disks and the fan modules are drawn out and placed in from the top of the chassis.

9. An electronic apparatus, comprising the storage chassis according to claim 1.

* * * * *